(12) United States Patent
Woo et al.

(10) Patent No.: US 6,806,552 B2
(45) Date of Patent: Oct. 19, 2004

(54) INTEGRATED INDUCTIVE CIRCUITS

(75) Inventors: Chong Woo, Fremont, CA (US); Clement Szeto, Union City, CA (US); Ting-Wah Wong, Cupertino, CA (US)

(73) Assignee: Altera, Corp., San Jose, CA (US)

( * ) Notice: Subject to any disclaimer, the term of this patent is extended or adjusted under 35 U.S.C. 154(b) by 0 days.

(21) Appl. No.: 10/201,810

(22) Filed: Jul. 24, 2002

(65) Prior Publication Data

US 2003/0155617 A1 Aug. 21, 2003

Related U.S. Application Data

(63) Continuation-in-part of application No. 10/081,089, filed on Feb. 21, 2002.

(51) Int. Cl.[7] ............................................. H01L 29/00
(52) U.S. Cl. ............................ 257/531; 257/E23.009; 257/E23.062; 600/309; 600/345
(58) Field of Search ................ 257/E23.009, E23.062; 600/309, 345, 347; 428/209, 698, 901

(56) References Cited

U.S. PATENT DOCUMENTS 4,663,215 A * 5/1987 Dubuisson et al. .......... 428/209
6,480,730 B2 * 11/2002 Darrow et al. .............. 600/347

* cited by examiner

Primary Examiner—David Nelms
Assistant Examiner—Mai-Huong Tran
(74) Attorney, Agent, or Firm—Martine & Penilla, LLP

(57) ABSTRACT

An integrated inductor may be formed over a substrate. An aperture may be formed by a backside etch through the semiconductor substrate underneath the integrated inductor. The aperture may then be filled with a dielectric material. As a result of the removal of the underlying substrate material, magnetic and capacitive coupling of the inductor to the substrate may be reduced. In addition, in some cases, the presence of the dielectric may facilitate attachment of the resulting die to a leadframe and package without degrading the inductor's performance and may provide better structural support.

8 Claims, 2 Drawing Sheets

INTEGRATED INDUCTIVE CIRCUITS

CROSS-REFERENCE TO RELATED APPLICATION

This is a continuation-in-part of U.S. application Ser. No. 10/081,089, filed Feb. 21, 2002.

BACKGROUND

This invention relates generally to radio frequency (RF) integrated circuits that include active devices and passive components such as inductors and capacitors used for radio frequency devices such as cellular telephones and wireless network devices such as Bluetooth and other wireless devices and personal digital assistants.

The technology for manufacturing integrated circuits has conventionally divided integrated circuits into various categories based on the compatibility of processes and other considerations. Generally, radio frequency circuits have not been mixed with logic circuits in the same integrated circuit. Radio frequency circuits are analog circuits that are involved in filtering and detecting radio frequency signals such as cellular telephone signals. In contrast, logic circuits generally include transistors and other active components that form digital integrated circuit devices. Thus, for example, bipolar techniques may be utilized to manufacture radio frequency circuits and standard complementary metal oxide semiconductor (CMOS) processes may be utilized to manufacture logic circuits.

Memory circuits may account for still another category. Generally, special processes may be utilized in connection with the manufacture of memory circuits because of special design considerations such as multiple gate electrodes and special voltage supply needs. Thus, memory circuits are often fabricated separately from logic circuits.

Still another category are the so-called mixed signal circuits which may include both digital and analog components. These signals too may be accounted for separately so that a device that includes RF signal processing, RF integrated circuits, mixed signal circuits, logic circuits and memory circuits may be made up of a number of separately fabricated integrated circuit chips.

The cost of an electronic device may be closely correlated to the extent of integration that is possible. The more devices and the more types of devices that can be integrated into a single integrated circuit and manufactured using highly replicated techniques, the lower the resulting price. Unfortunately, because of incompatibilities between the different types of integrated circuits, it has not been possible, to date, to fabricate both radio frequency circuits, mixed signal circuits, logic circuits and memory circuits all on the same standard CMOS integrated circuit process.

One problem that arises in connection with radio frequency circuits in CMOS processes is that the passive components such as capacitors and inductors may be adversely affected by the substrates over which they are formed. In particular, coupling may occur between the substrate and integrated circuit inductors for example. This coupling may result in degraded performance of inductive circuits. As a result, inductive circuits may be formed in bipolar or silicon over insulator (SOI) integrated circuits rather than using standard CMOS logic processes. Thus, two or more integrated circuits are needed—one for logic, one for RF circuits, one for memory and one for mixed signals.

Some efforts have been made to overcome this coupling problem. For example, Silicon Wave Inc. has devised a so-called silicon over insulator (SOI) BiCMOS (Bipolar CMOS) integrated circuit which integrates both logic and radio frequency components onto the same die. However, the use of silicon over insulator technology greatly complicates the manufacturing process and increases cost. Moreover, the bulk of semiconductor fabrication facilities in the United States and the rest of the world are dedicated to manufacturing metal oxide semiconductor technologies. The SOI process is not amenable to widespread manufacturing at a number of highly expensive, already existent, fabrication facilities.

In addition to capacitive coupling of substrate noise, magnetic coupling between integrated inductors on the same integrated circuit may also be problematic. The coupling between integrated inductors on the same circuit may adversely effect the operation of any given inductor. For example, the magnetic coupling may change the operating parameters of one or more integrated inductors on the same integrated circuit.

The quality factor or Q factor strongly depends on the layout and the properties of the particular process technology. It is known that the quality of an integrated inductor may be adversely affected by the metal wire resistance, capacitive coupling to the substrate and magnetic coupling to the substrate. Capacitive and magnetic coupling limit the Q factor at relatively high frequencies. The magnetic coupling becomes more significant in CMOS technologies with doped substrates because the effect of substrate resistance appears in parallel with the inductor.

Thus, there is a substantial need to find a way to reduce coupling in integrated inductors.

DETAILED DESCRIPTION

Figure 1:
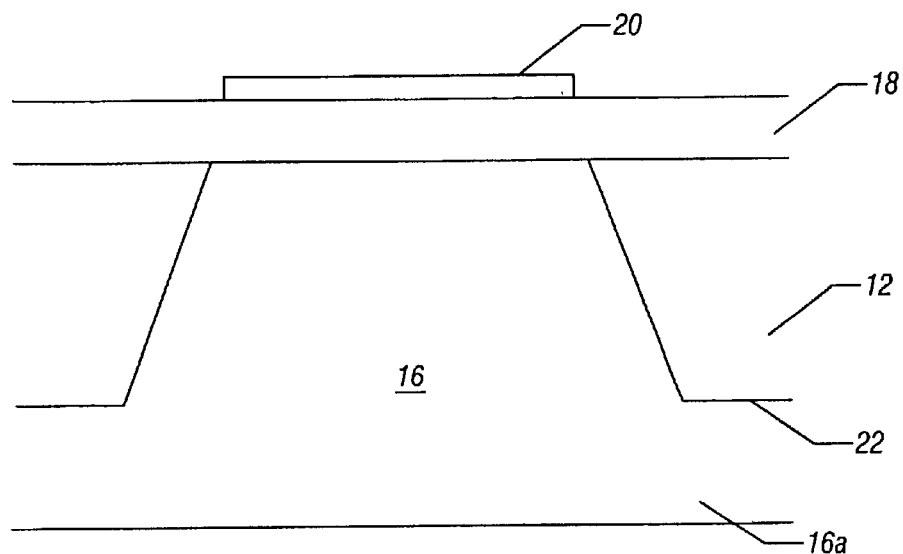
FIG. 1 is an enlarged cross-sectional view of one embodiment of the present invention.

Referring to FIG. 1, an integrated inductor 20 may be formed over a field oxide region 18 in turn formed over a semiconductor substrate 12. This substrate 12 has an aperture 14 formed therein that is filled with a dielectric material 16. In one embodiment, the aperture 14 may be a conical section.

Figure 2:
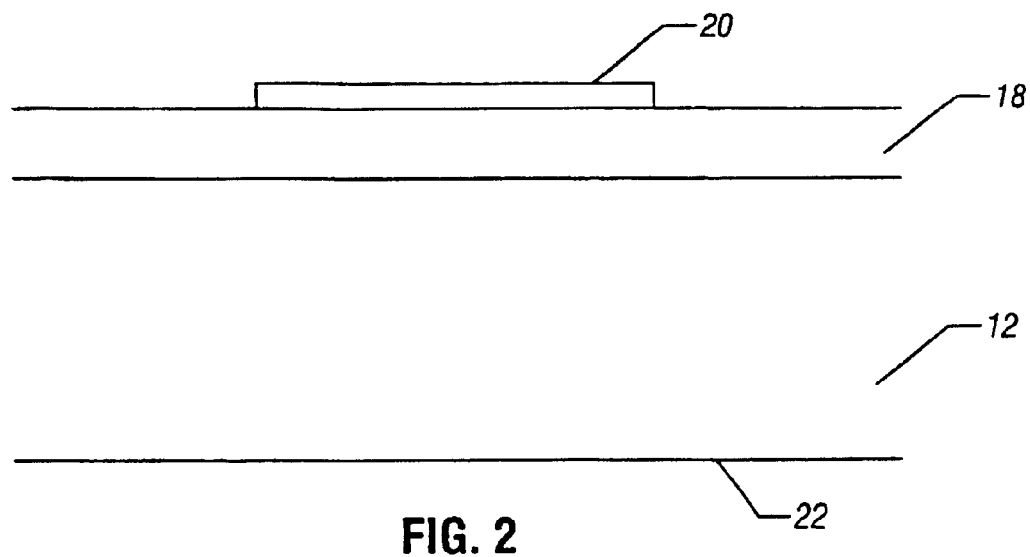
FIG. 2 is an enlarged cross-sectional view of one stage in the sequence of making the device shown in FIG. 1 in accordance with one embodiment of the present invention.

Referring to FIG. 2, the sequence of making the device shown in FIG. 1 may begin by forming a field oxide region 18 over a substrate 12. The integrated inductor 20 is then patterned on top of the field oxide region 18. A variety of techniques may be utilized for forming integrated inductor 20. Commonly the integrated inductor 20 may have a spiral configuration. However, any of a variety of integrated inductors may be utilized in embodiments of the present invention.

The integrated inductor 20, if formed in the fashion shown in FIG. 2, may experience capacitive and magnetic coupling with other components formed in the same substrate 12. It may be desirable to form the inductor 20 together with other components in the same substrate 12. Those other components may include a variety of other devices including logic, memory, and mixed signal devices. Particularly, where the inductor 20 is utilized in a radio frequency circuit, the capacitive and magnetic coupling through the substrate 12 may become problematic especially at relatively high frequencies.

Figure 3:
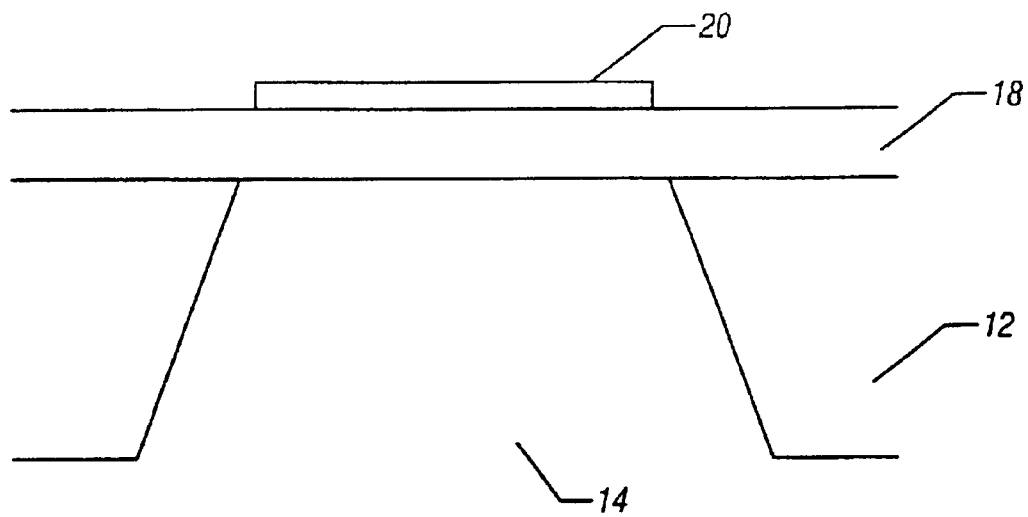
FIG. 3 is an enlarged cross-sectional view of another stage in the sequence of manufacturing the device shown in FIG. 1 in accordance with one embodiment of the present invention.

In order to address these concerns, in accordance with one embodiment of the present invention, an aperture 14 may be etched from the back side 22 of the substrate 12 to form an aperture 14 as shown in FIG. 3. The etching process used to form the aperture 14 may be any conventional anisotropic or isotropic back side etch. In one embodiment, the etching may extend completely through the substrate 12 to the field oxide region 18. Thus, an etching process may be utilized that uses the field oxide region 18 as an etch stop in one embodiment.

As a result of the back side etch used to form the aperture 14, a floating membrane inductor 20 may be formed in one embodiment. Thereafter, the aperture 14 is filled with a dielectric material 16, as shown in FIG. 1. The dielectric material 16 may be deposited, spun-on or applied by any other technique. Any of a variety of dielectric materials are suitable. In one embodiment, the dielectric material 16 is coated over the backside 22 of the substrate 12 as indicated at 16*a*.

After the die is completed with the dielectric material 16 in place, a conductive or nonconductive epoxy may be utilized to attach the die to a leadframe (not shown) of a semiconductor package. The epoxy will not degrade the inductor's performance because of the presence of the dielectric layer 16, including in some embodiments the portion 16*a* completely covering the back side 22 of the substrate 12, as shown in FIG. 1. In addition, the dielectric material 16 may provide structural support in the region of the substrate 12 where the aperture 14 was formed.

Figure 4:
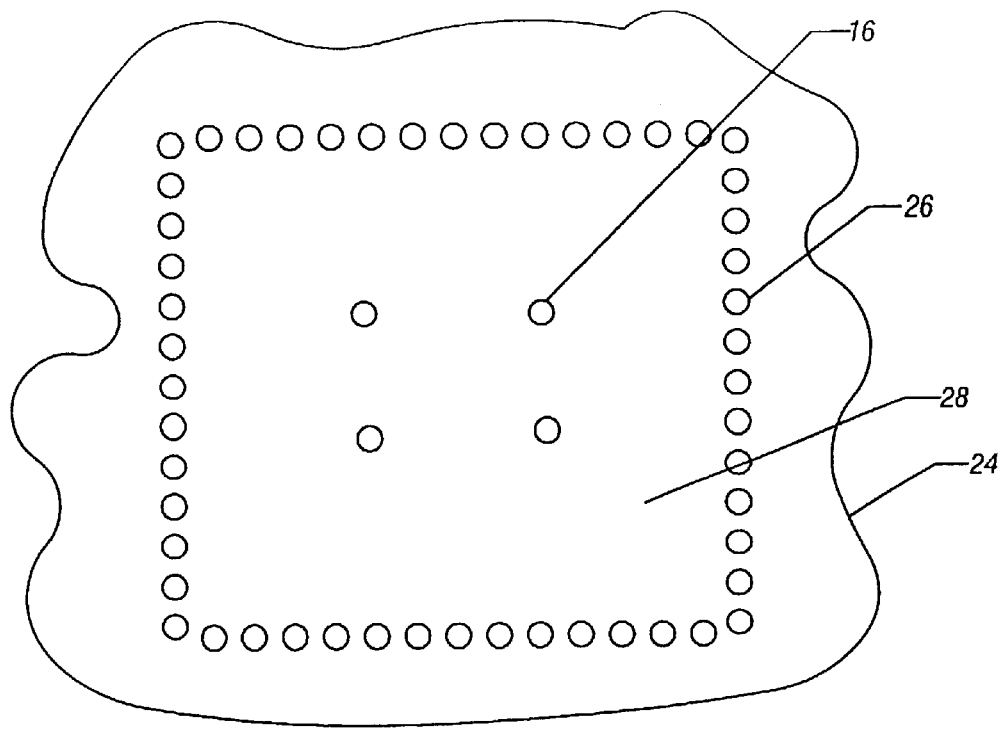
FIG. 4 is a bottom view of a wafer according to one embodiment of the present invention.

Referring to FIG. 4, a wafer 24 may be formed with a series of scribe holes 26 to define individual dice 28 within the wafer 24. The scribe holes 26 may be used to facilitate the separation of dice from the overall wafer 24.

In accordance with one embodiment of the present invention, the scribe holes 26 may be formed by etching through the backside of the wafer 24 using the techniques already described herein. Thus, in some embodiments of the present invention, the holes 16 and the scribe holes 26 may be formed at the same time. In other words, the holes 16 and 26 may be formed in the same process steps. As a result, the formation of either the holes 16 or the holes 26 do not in any way significantly increase the expense or processing time for the overall process, as compared to a process which only made either the scribe holes 26 or the holes 16. As a result, the formation of the holes 16 does not significantly impact the overall wafer processing in some embodiments of the present invention, and, particularly, those that use the scribe holes 26.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a substrate;
   an integrated inductor formed over a first side of said substrate;
   an aperture formed in said substrate from a second side of said substrate underneath said inductor;
   a dielectric material formed in said aperture; and
   a plurality of scribe holes in said substrate.

2. The circuit of claim 1 including an intervening layer between said inductor and said substrate.

3. The circuit of claim 2 wherein said intervening layer is a field oxide region.

4. The circuit of claim 2 wherein said aperture is formed completely through said substrate to said intervening layer.

5. The circuit of claim 4 wherein said aperture encompasses the entire region beneath said integrated inductor.

6. An integrated circuit comprising:
   a substrate;
   an inductor formed over a first side of said substrate;
   an aperture formed in said substrate from a second side of said substrate underneath said inductor and extending completely through said substrate from said second side of said substrate to said first side of said substrate;
   a dielectric material filling said aperture;
   a dielectric material also coating the back side of said substrate;
   an intervening layer between said inductor and said substrate; and
   a plurality of scribe holes formed in said substrate.

7. The circuit of claim 6 wherein said intervening layer is a field oxide region.

8. The circuit of claim 7 wherein said aperture encompasses the entire region beneath said integrated inductor.

* * * * *